United States Patent
Okuno et al.

(10) Patent No.: US 7,202,147 B2
(45) Date of Patent: Apr. 10, 2007

(54) SEMICONDUCTOR DEVICE AND METHOD FOR FABRICATING THE SAME

(75) Inventors: Yasutoshi Okuno, Kyoto (JP); Michikazu Matsumoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 4 days.

(21) Appl. No.: 11/288,093

(22) Filed: Nov. 29, 2005

(65) Prior Publication Data

US 2006/0138562 A1    Jun. 29, 2006

(30) Foreign Application Priority Data

Nov. 30, 2004   (JP)   ............................ 2004-345391
Nov. 21, 2005   (JP)   ............................ 2005-335311

(51) Int. Cl.
*H01L 29/06*    (2006.01)
*H01L 21/336*   (2006.01)

(52) U.S. Cl. ...................... 438/582; 438/583; 438/655; 438/664; 438/682; 257/382; 257/384; 257/E29.16

(58) Field of Classification Search ................ 438/583, 438/582, 655, 664, 682; 257/377, 382, 384, 257/E29.161, E21.139
See application file for complete search history.

(56) References Cited

U.S. PATENT DOCUMENTS

| | | | |
|---|---|---|---|
| 5,322,809 A * | 6/1994 | Moslehi ...................... 438/303 |
| 5,659,194 A * | 8/1997 | Iwamatsu et al. ............ 257/377 |
| 6,303,504 B1 | 10/2001 | Lin |
| 6,458,678 B1 * | 10/2002 | Spikes et al. ................ 438/592 |
| 6,548,877 B2 * | 4/2003 | Yang et al. .................. 257/382 |
| 6,642,119 B1 * | 11/2003 | Pelella et al. ............... 438/303 |
| 6,674,135 B1 * | 1/2004 | Cheek et al. ................ 257/408 |
| 6,689,688 B2 | 2/2004 | Besser et al. |
| 2002/0008295 A1 * | 1/2002 | Yang et al. .................. 257/413 |
| 2002/0142524 A1 * | 10/2002 | En et al. ..................... 438/151 |
| 2004/0061184 A1 * | 4/2004 | Lu et al. ..................... 257/384 |
| 2005/0045965 A1 * | 3/2005 | Lin et al. .................... 257/384 |
| 2005/0258499 A1 * | 11/2005 | Huang et al. ................ 257/382 |

OTHER PUBLICATIONS

Kim, M., et al. "High Thermal Stability of Ni Monosilicide from Ni-Ta Alloy Films on Si(100)." Electrochemical and Solid-State Letters 6(10), 2003, pp. G122-G125.

(Continued)

*Primary Examiner*—Matthew Smith
*Assistant Examiner*—Nicholas J. Tobergte
(74) *Attorney, Agent, or Firm*—McDermott Will & Emery LLP

(57) ABSTRACT

A semiconductor device includes: a gate electrode formed on a silicon substrate; source/drain regions formed at both sides of the gate electrode in the silicon substrate; and a silicide layer formed on the source/drain regions. The silicide layer includes a first silicide layer mainly made of a metal silicide having a formation enthalpy lower than that of NiSi and a second silicide layer formed on the first silicide and made of Ni silicide.

6 Claims, 6 Drawing Sheets

OTHER PUBLICATIONS

Xiang, R., et al. "Formation of Ni Silicide by Addition of Hf." Preliminary Material for 65th Annual Meeting of Japanese Society of Applied Physics, Sep. 1-4, 2004, pp. 708.

Ok, Y., et al. "Effect of Mo Interlayer on the Electrical and Structural Properties of Nickel Silicides." Journal of the Electrochemical Society 150(7), 2003, pp. G385-G388.

Maa, J., et al. "Effect of interlayer on thermal stability of nickel silicide." Journal of Vacuum Science and Technology 19(4), 2001, pp. 1595-1599.

Mangelinck, D., et al. "Enhancement of thermal stability of NiSi films on (100)Si and (111) Si by Pt addition." Applied Physics Letters 75(12), 1999, pp. 1736-1738.

D'Heurle, F., et al. "Resistivity of the solid solutions (Co-Ni)Si2" American Institute of Physics 1(1), 1986, pp. 177-180.

Sze, S., et al. "Semiconductor Device: Physics and Technology" Sangyo Tosho Co. Ltd., 1987, pp. 174-175.

Mann, R., et al. "Thermodynamic parameters of TM silicides" Properties of Metal Silicides, INSPEC, the Institution of Electrical Engineers, 1995, pp. 55-60.

\* cited by examiner

SEMICONDUCTOR DEVICE AND METHOD FOR FABRICATING THE SAME

BACKGROUND OF THE INVENTION (1) Field of the Invention

The present invention relates to semiconductor devices and methods for fabricating the same, and particularly relates to a structure of a silicide layer and a method for forming the silicide layer.

(2) Description of the Related Art

In general metal oxide semiconductor (MOS) transistors, reduction of parasitic resistance such as contact resistance and wiring resistance is important in increasing operation speed. The reduction of parasitic resistance in such transistors is generally achieved by siliciding upper portions of source/drain regions and upper portions of gate electrodes.

To increase the integration degree of a large-scale semiconductor integrated (LSI) circuit device, reduction of the vertical size as well as the horizontal size is needed. As a technique for reducing the vertical size, the junction depth of a doped layer to be source/drain regions needs to be reduced. However, if the thickness of the doped layer in the semiconductor substrate is small, there arises a problem in which the resistance of the doped layer increases so that the operation speed of the semiconductor device decreases. To prevent this decrease, it is effective to reduce the source/drain resistance by using a structure in which a metal silicide layer is formed in the surface of the doped layer. As a method for forming the metal silicide layer, a method in which a metal film is deposited over a silicon substrate and polysilicon to be a gate electrode, and is then subjected to heat treatment such that silicon and metal react with each other to form silicide in upper portions of source/drain regions and an upper portion of the gate electrode has been conventionally used.

As a material for a silicide layer, a material capable of reducing the amount of silicon consumed during silicidation for a shallow junction is needed. In view of this, a silicide formation technique using, as a material capable of reducing the amount of consumed silicon, nickel (Ni) that forms low-resistance monosilicide has been developed.

However, it is known that $NiSi_2$, which is a disilicide phase of Ni silicide, has a lattice constant fairly close to that of silicon and forms an inverted-pyramidal interface by subsequent high-temperature heat treatment or under inappropriate process conditions. As a method for forming Ni silicide with stability by enhancing resistance (heat resistance) to subsequent high-temperature heat treatment, a method for forming an alloyed silicide has been proposed (see, for example, patent literature 1: U.S. Pat. No. 6,689, 688). In this patent, examples of elements having the effect of stabilizing NiSi, which is a low-resistance monosilicide phase, include Ge, Ti, Re, Ta, N, V, Ir, Cr and Zr (see, for example, non-patent literature 1: Min-Joo Kim et al., "High Thermal Stability of Ni Monosilicide from Ni—Ta Alloy Films on Si(100)", Electrochem. Solid-State Lett. 6, 2003, G122-G125). In addition, it is suggested in a report that Hf, which is an element exhibiting physical/chemical properties similar to those of Zr, also has a similar effect (see, for example, non-patent literature 2: R. Xiang (in Tokyo institute of Technology) et al., "Formation of Ni Silicide by Addition of Hf", Preliminary Material for 65th Annual Meeting of Japanese Society of Applied Physics, P. 708, September 1 to 4, Autumn in 2004 (Lecture No. 2P-M-10)). It is also suggested in other reports that elements such as Mo, Ir, Co and Pt have similar advantages (see, for example, non-patent literature 3: Young-Woo Ok, et al., "Effect of a Mo Interlayer on the Electrical and Structural Properties of Nickel Silicides", J. Electrochem. Soc. 150, 2003, G385-G388, non-patent literature 4: Jer-shen Maa, et al., "Effect of interlayer on thermal stability of nickel silicide", J. Vac. Sci. Technol. A 19, 2001, pp. 1595–1599, and non-patent literature 5: D. Mangelinck et al., "Enhancement of thermal stability of NiSi films on (100)Si and (111)Si by Pt addition", Appl. Phys. Lett., 1999, vol. 75, num. 12, pp. 1736–1738).

SUMMARY OF THE INVENTION

However, it is reported that in the case of forming an alloyed silicide with the foregoing conventional techniques, coexistence of different elements in a silicide layer causes alloy scattering, resulting in increase of resistance (see, for example, non-patent literature 6: F. M. d'Heurle et al., "Resistivity of the solid solutions (Co—Ni)$Si_2$", J. Appl. Phys. 59, 1986, pp. 177–180). The interface resistance generated at the interface between NiSi and silicon serves as parasitic resistance that effectively increases the resistances of a silicide layer and a source/drain doped layer located under the silicide layer, resulting in causing deterioration of transistor performance. As the transistor size has been reduced, the influence of the interface resistance on transistor characteristics has increased, so that reduction of the interface resistance is a task for future technology.

It is therefore an object of the present invention to form an excellent Ni silicide layer by achieving both stable formation of a NiSi layer, which is a low-resistance layer, and reduction of the interface resistance generated at the interface between NiSi and silicon.

To achieve the object, the present inventors have conducted various studies, to obtain the following findings. That is, it is known that the interface resistance between NiSi and silicon and the Schottky barrier height have a relationship represented by the following expression (1):

$$R_c \propto \exp\left(\frac{C \cdot \Phi_B}{\sqrt{N_D}}\right) \quad (1)$$

where $R_c$ is an interface resistance, C is a constant, $\Phi_B$ is a Schottky barrier height (eV), and $N_D$ is a silicon substrate doping concentration ($cm^{-3}$) (see, for example, non-patent literature 7: S.M.Sze, "Semiconductor Device" published in 1987 by Sangyo Tosho Co. Ltd., Tokyo, Japan, pp. 174 to 175).

As seen from Expression (1), the interface resistance between NiSi and silicon is proportional to the exponential function of the Schottky barrier height between silicide and silicon. Accordingly, if a relatively-large Schottky barrier height (0.68 eV) between NiSi and silicon is reduced, the interface resistance is reduced.

Based on the foregoing findings, the present inventors have conceived of the following invention.

Specifically, a first semiconductor device according to the present invention includes: a gate electrode formed on a silicon substrate; source/drain regions formed at both sides of the gate electrode in the silicon substrate; and a silicide layer formed on the source/drain regions. The silicide layer includes a first silicide layer mainly made of a metal silicide having a formation enthalpy lower than that of NiSi and a second silicide layer formed on the first silicide layer and made of Ni silicide.

A second semiconductor device according to the present invention includes: a gate electrode formed on a silicon substrate; source/drain regions formed at both sides of the gate electrode in the silicon substrate; and a silicide layer formed on the source/drain regions. The silicide layer includes a first silicide layer which is an alloy layer made of Ni silicide and a metal silicide having a formation enthalpy lower than that of NiSi and a second silicide layer formed on the first silicide layer and made of Ni silicide.

In the first or second semiconductor device, the metal silicide having a formation enthalpy lower than that of NiSi may be a silicide made from a material selected from the group consisting of Hf, Zr, Mo, Ta and V.

A first method for fabricating a semiconductor device according to the present invention includes the steps of: forming a gate electrode on a silicon substrate; forming source/drain regions at both sides of the gate electrode in the silicon substrate; and forming a silicide layer with a multi-layer structure on the source/drain regions. In the step of forming the silicide layer, a first silicide layer mainly made of a metal silicide having a formation enthalpy lower than that of NiSi is formed on the source/drain regions, and then a second silicide layer made of Ni silicide is formed on the first silicide layer.

A second method for fabricating a semiconductor device according to the present invention includes the steps of: forming a gate electrode on a silicon substrate; forming source/drain regions at both sides of the gate electrode in the silicon substrate; and forming a silicide layer with a multi-layer structure on the source/drain regions. In the step of forming the silicide layer, a metal capable of forming a metal silicide having a formation enthalpy lower than that of NiSi is introduced by ion implantation in the source/drain regions, then a Ni silicide film is formed on the source/drain regions, and then heat treatment is performed, thereby forming a first silicide layer which is an alloy layer made of Ni silicide and a metal silicide having a formation enthalpy lower than that of NiSi on the source/drain regions and also forming a second silicide layer made of Ni silicide on the first silicide layer.

A third method for fabricating a semiconductor device according to the present invention includes the steps of: forming a gate electrode on a silicon substrate; forming source/drain regions at both sides of the gate electrode in the silicon substrate; and forming a silicide layer with a multi-layer structure on the source/drain regions. In the step of forming the silicide layer, a Ni silicide film is formed on the source/drain regions, then a metal capable of forming a metal silicide having a formation enthalpy lower than that of NiSi is introduced by ion implantation in at least a lower portion of the Ni silicide film and the Ni silicide film is changed into an amorphous state, and then the amorphous Ni silicide film is recrystallized by heat treatment, thereby forming a first silicide layer which is an alloy layer made of Ni silicide and a metal silicide having a formation enthalpy lower than that of NiSi on the source/drain regions and also forming a second silicide layer made of Ni silicide on the first silicide layer.

In the first, second or third method, the metal silicide having a formation enthalpy lower than that of NiSi may be a silicide made from a material selected from the group consisting of Hf, Zr, Mo, Ta and V.

According to the present invention, a silicide layer containing a metal silicide having an enthalpy of formation (formation enthalpy) lower than that of NiSi is provided, i.e., a silicide layer having a lattice constant different from that of silicon is provided, at the interface between silicide and silicon, so that generation of $NiSi_2$ forming an inverted-pyramidal silicide-silicon interface caused by lattice-constant matching with silicon is suppressed. Accordingly, the NiSi layer serving as a low-resistance layer is stabilized. In addition, the provision of a silicide layer including a metal silicide having a formation enthalpy lower than that of NiSi at the interface between silicide and silicon reduces the Schottky barrier height between silicide and silicon that is proportional to the formation enthalpy. Accordingly, the interface resistance between silicide and silicon that is proportional to the exponential function of the Schottky barrier height is reduced. In this manner, both stable formation of a NiSi layer as a low-resistance layer and reduction of the interface resistance at the interface between NiSi and silicon are achieved, so that an excellent Ni silicide layer is formed. Accordingly, a semiconductor device capable of being miniaturized and operating at high speed is implemented.

As described above, the present invention relates to semiconductor devices and methods for fabricating the same. In applications to semiconductor integrated circuit devices including silicide layers, for example, miniaturization and increase of the operation speed are achieved, and thus the present invention is very useful.

DETAILED DESCRIPTION OF THE INVENTION

Embodiment 1

Hereinafter, a semiconductor device according to a first embodiment of the present invention, specifically a semiconductor device including a MOS transistor, and a method for fabricating the device will be described with reference to the drawings.

FIGS. 1A through 1D and FIGS. 2A through 2D are cross-sectional views showing process steps of a method for fabricating a semiconductor device of this embodiment.

Figure 1A:
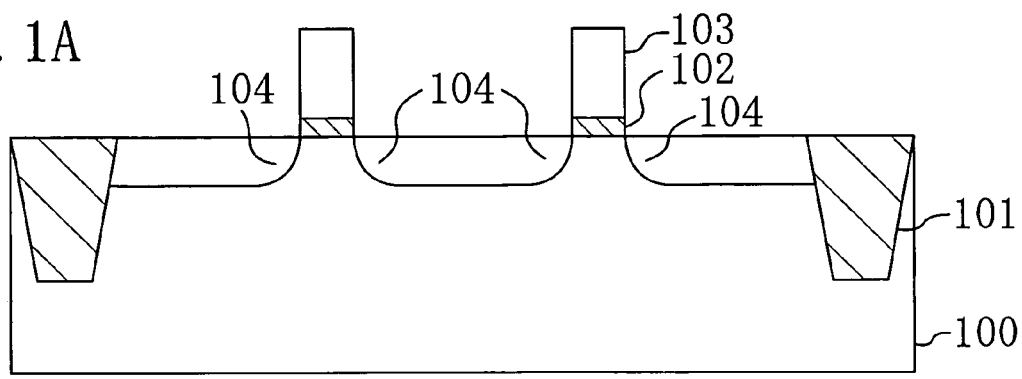
FIGS. 1A through 1D are cross-sectional views showing process steps of a method for fabricating a semiconductor device according to a first embodiment of the present invention.

First, as shown in FIG. 1A, a shallow trench isolation 101 is formed in an upper portion of a silicon substrate 100 so as to define transistor regions. Thereafter, a gate insulating film 102 made of a silicon oxide film and having a thickness of about 2 nm is formed on the transistor regions, and then a polysilicon film having a thickness of about 140 nm is formed over the entire surface of the silicon substrate 100. Subsequently, the polysilicon film is selectively etched, thereby forming gate electrodes 103. Then, ion implantation is performed with the gate electrodes 103, for example, used as a mask so that a lightly-doped layer (low-concentration impurity diffusion layer) 104 is formed in the silicon substrate 100 at both sides of the gate electrodes 103 in a self aligned manner.

Figure 1B:
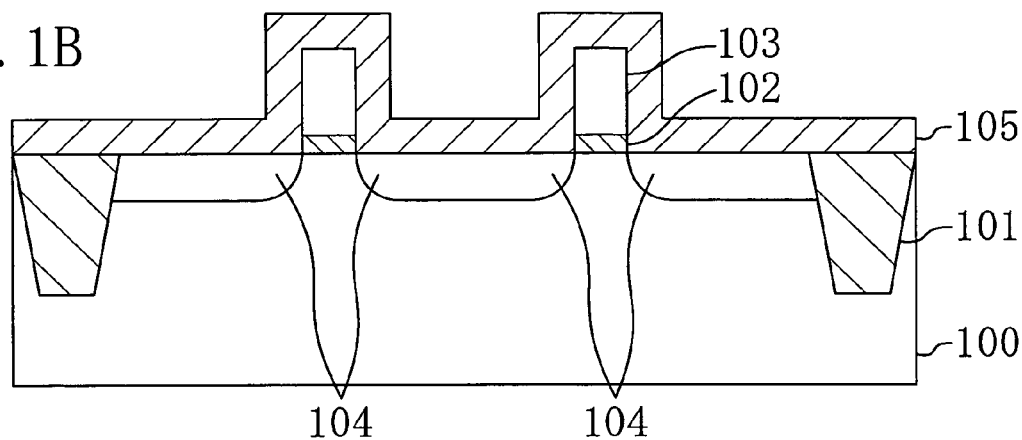

Next, as shown in FIG. 1B, a silicon oxide film 105 is deposited to a thickness of, for example, about 50 nm over the entire surface of the silicon substrate 100 by low pressure (LP)-chemical vapor deposition (CVD) under conditions of, for example, a susceptor temperature of 400° C.

Figure 1C:
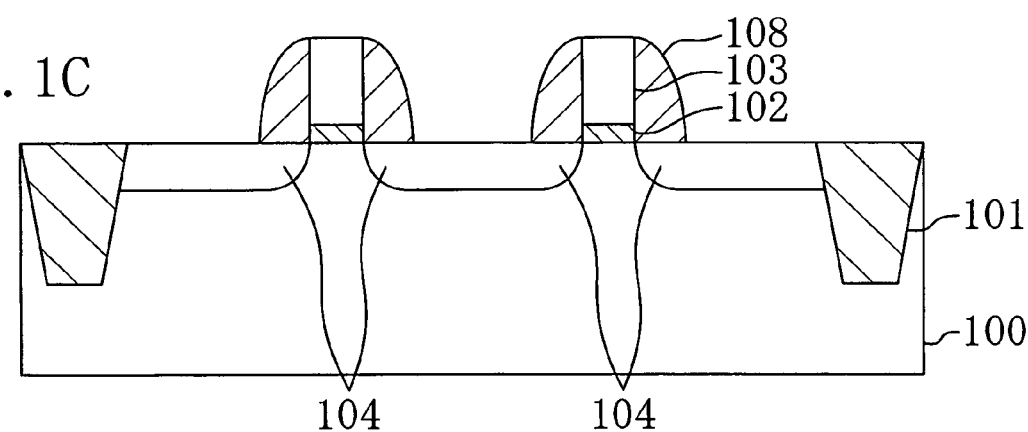

Then, as shown in FIG. 1C, the entire surface of the silicon oxide film 105 is etched back by dry etching under conditions of, for example, a $CHF_3$ flow rate of 120 $cm^3$/min (standard condition), an $O_2$ flow rate of 5 $cm^3$/min (standard condition), a pressure of 8 Pa, and a power of 110W, thereby forming sidewall spacers 108 on the side faces of the gate electrodes 103.

Figure 1D:
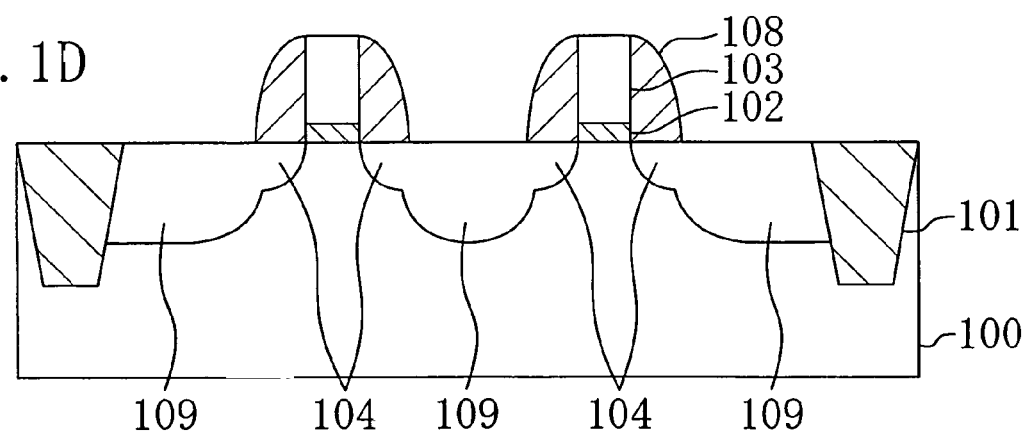

Thereafter, as shown in FIG. 1D, ion implantation is performed with the gate electrodes 103 and the sidewall spacers 108, for example, used as a mask, thereby forming a heavily-doped layer (high-concentration impurity diffusion layer) 109 to be source/drain regions at both sides of the sidewall spacers 108 in the silicon substrate 100 in a self alignment manner.

Figure 2A:
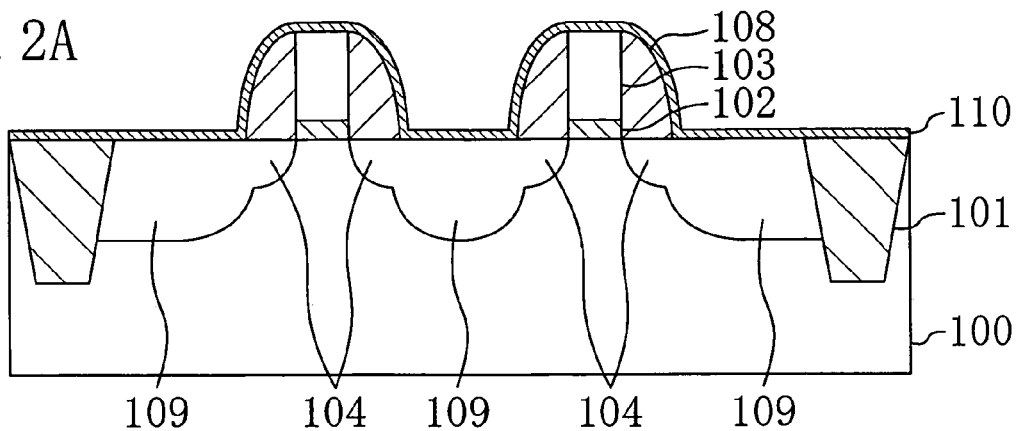
FIGS. 2A through 2D are cross-sectional views showing process steps of a method for fabricating a semiconductor device of the first embodiment.

Subsequently, as shown in FIG. 2A, Ar sputtering is performed under conditions of, for example, a pressure of 2 mTorr (266 mPa) and a DC power of 100 W, thereby depositing a hafnium (Hf) film 110 to a thickness of, for example, about 3 nm over the entire surface of the silicon substrate 100.

Figure 2B:
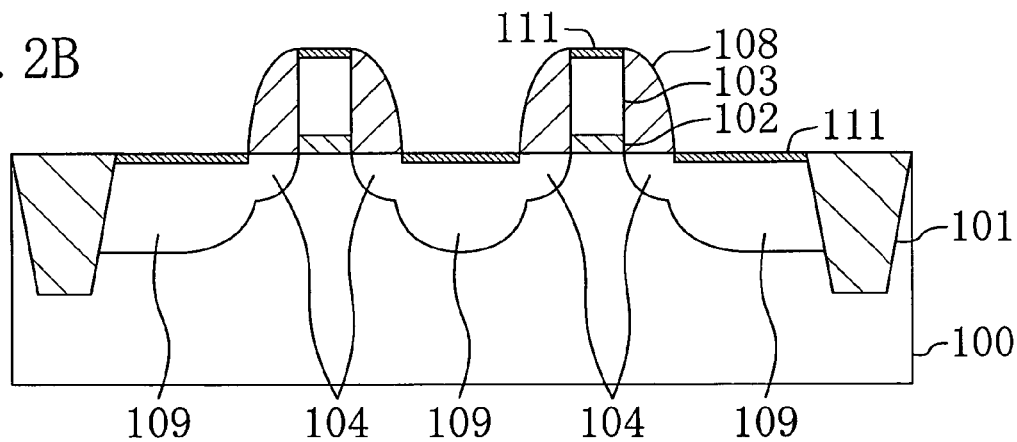

Then, as shown in FIG. 2B, after the deposition of the Hf film 110, a first rapid thermal annealing (RTA) process is performed with, for example, RTA apparatus at 600° C. for 30 seconds in an inert atmosphere, and then the unreacted part of the Hf film 110 is selectively removed. Accordingly, a desired Hf silicide layer 111 is formed only on the heavily-doped layer 109 and the gate electrodes 103. In this case, the removal of the unreacted part of the Hf film 110 is selectively performed with an acid chemical solution which is a mixture of, for example, either sulfuric acid or hydrochloric acid and a hydrogen peroxide solution. The temperature and time of this RTA process are optimized so as to obtain a desired silicide thickness of about 2 nm in the range from 500° C. to 700° C. and the range of 10 seconds to 90 seconds, respectively. After selective removal of the unreacted Hf film 110, to obtain a silicide such as HfSi or $Hf_3Si_2$ having a desired composition for the Hf silicide layer 111, an additional RTA process may be performed in an inert atmosphere.

Figure 2C:
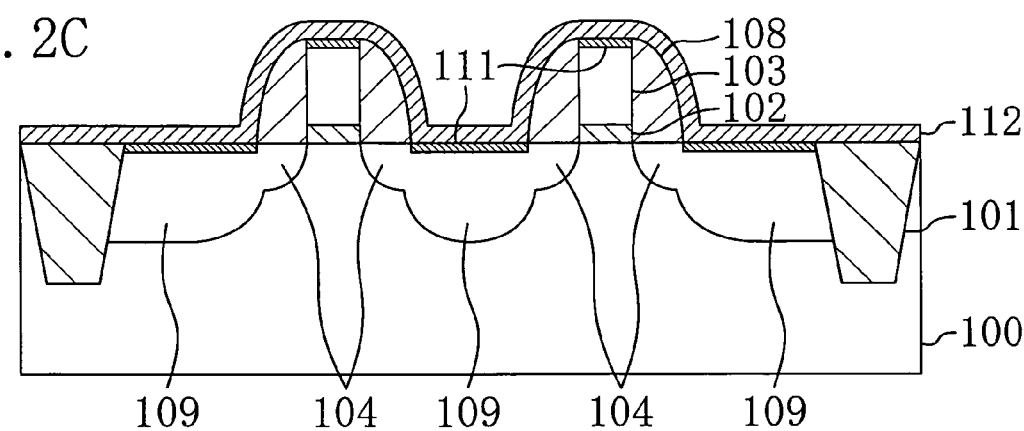

Thereafter, as shown in FIG. 2C, a Ni film 112 is deposited to a thickness of, for example, about 10 nm over the entire surface of the silicon substrate 100 by Ar sputtering under conditions of, for example, a pressure of 2 mTorr (266 mPa) and a DC power of 100 W.

Figure 2D:
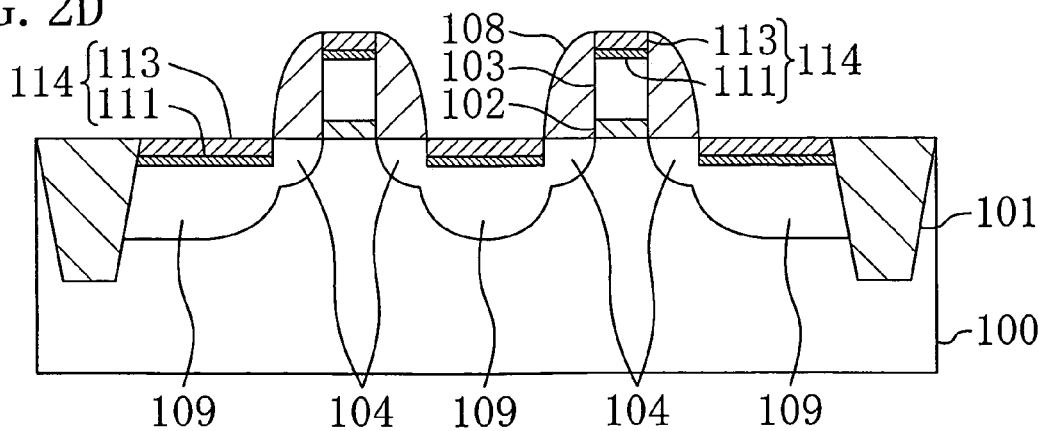

Subsequently, as shown in FIG. 2D, after the deposition of the Ni film 112, a second RTA process is performed with, for example, RTA apparatus at 400° C. for 30 seconds in an inert atmosphere so that silicon (i.e., silicon in the gate electrodes 103 and the silicon substrate 100) which is diffused through the Hf silicide (e.g., $Hf_3Si_2$) layer 111 serving as an interface layer is caused to react with the Ni film 112. Then, the unreacted part of the Ni film 112 is removed. Accordingly, a desired Ni silicide layer 113 is formed on the Hf silicide layer 111. The removal of the unreacted Ni film 112 is selectively performed with an acid chemical solution which is a mixture of, for example, either sulfuric acid or hydrochloric acid and a hydrogen peroxide solution.

Subsequently, to obtain NiSi (nickel monosilicide) having a desired composition and a low-resistance phase as the Ni silicide layer 113, a third RTA process is performed, for example, at 500° C. for 30 seconds in an inert atmosphere. In this manner, a multilayer silicide layer 114 of this embodiment that is a stack of a Hf silicide layer (first interface silicide layer) 111 serving as an interface layer and a Ni silicide layer (second surface silicide layer) 113 serving as a surface layer is obtained.

In the first embodiment, the Hf silicide layer 111 having a lattice constant different from that of silicon is provided as the interface layer between silicide and silicon, so that generation of $NiSi_2$ forming an inverted-pyramidal silicide-silicon interface caused by lattice-constant matching with silicon is suppressed. Accordingly, the Ni silicide layer (NiSi layer) 113 serving as a low-resistance layer is stabilized.

Figure 3:
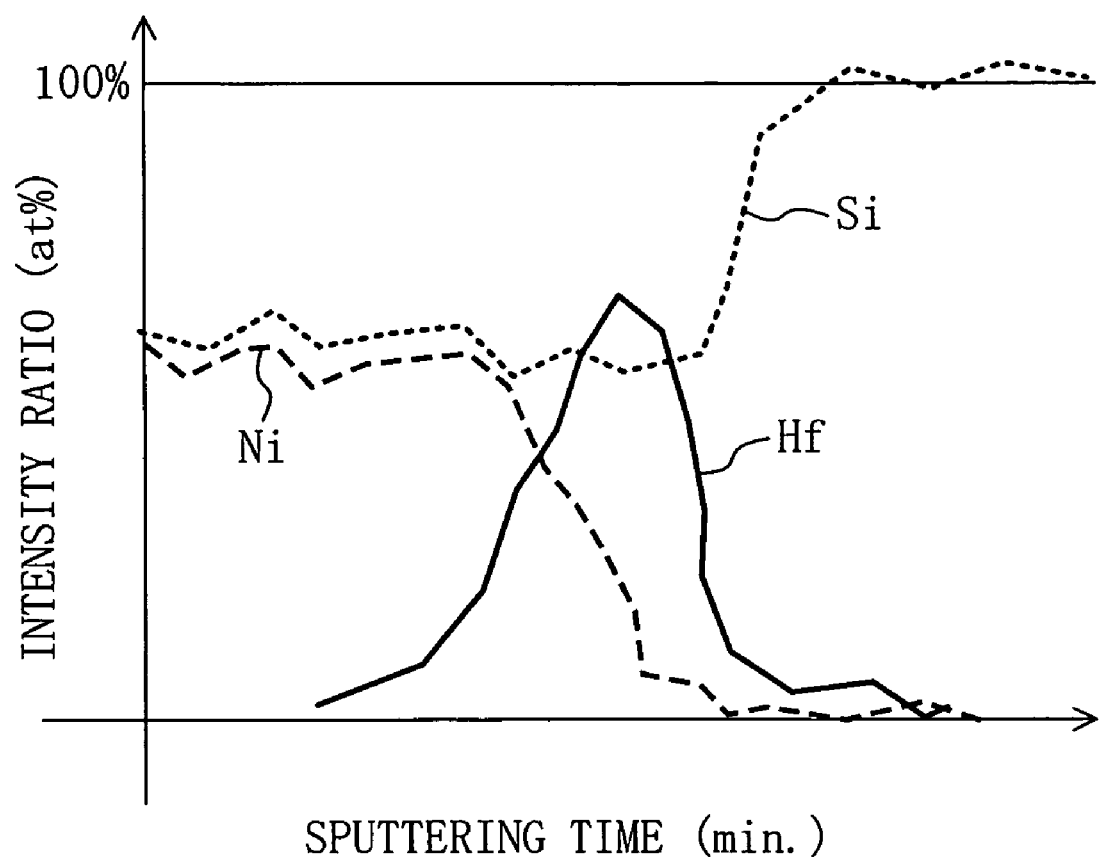
FIG. 3 is a graph showing distributions in the composition of a multilayer silicide layer in the depth direction in the semiconductor device of the first embodiment.

FIG. 3 shows distributions in the composition of the multilayer silicide layer 114 in the depth direction obtained by Auger analysis. In FIG. 3, the abscissa represents a sputtering time (min.) and the ordinate represents an Auger Electron Spectroscopy (AES) intensity ratio (at %). The amount of sputtering per a unit time is substantially constant, so that the sputtering time is proportional to the depth from the surface of the sputtered film.

As shown in FIG. 3, the Hf silicide layer 111 is formed near the interface with silicon. The Hf silicide layer 111 as the interface layer herein may include an element (e.g., Ni shown in FIG. 3) other than Hf and Si. In other words, the interface layer only needs to be a silicide layer mainly made of Hf silicide.

It is experientially known that the Schottky barrier height between silicide and silicon and the enthalpy of formation (formation enthalpy) of silicide have a relationship expressed by the following equation (2):

$$\Phi_b = 0.83 + 0.18 \cdot \Delta Hf \quad (2)$$

where $\Delta Hf$ is a formation enthalpy (see, for example, non-patent literature 8: Karen Maex et al., "Properties of Metal Silicide", the institution of electrical engineers, London, United Kingdom, 1995, p. 57). That is, the lower the formation enthalpy (negative value) of a metal silicide material is, the smaller the height of the Schottky barrier between silicide and silicon is Accordingly, though the NiSi formation enthalpy is about −85 kJ/mol, the Hf silicide layer 111 having a formation enthalpy of about −180 kJ/mol is used as the first silicide layer serving as the interface layer. Accordingly, the Schottky barrier height between silicide and silicon is reduced, as compared to a case where NiSi and silicon are in contact with each other. As a result, in this embodiment, the interface resistance proportional to the exponential function of the Schottky barrier height between silicide and silicon is reduced by about 15%, as compared to the case where NiSi and silicon are in contact with each other. In this manner, a silicide layer mainly made of a metal silicide having a formation enthalpy lower than that of NiSi is formed as the interface layer (first silicide layer), so that the Schottky barrier height between silicide and silicon is reduced. This reduces the interface resistance between silicide and silicon.

As described above, in this embodiment, both stable formation of a NiSi layer as a low-resistance layer and reduction of the interface resistance at the interface between NiSi and silicon are achieved, so that an excellent Ni silicide layer is formed. Accordingly, a semiconductor device capable of being miniaturized and operating at high speed is implemented.

In this embodiment, Hf silicide is used for the interface layer (first silicide layer). Alternatively, other metal silicides having generation enthalpies lower than that of NiSi, e.g., Zr silicide, Mo silicide, Ta silicide and V silicide, may be used. In particular, the use of a metal silicide having a formation enthalpy of −250 kJ/mol or less, such as $Hf_5Si_3$, $Zr_5Si_3$, $Mo_5Si_3$, $Ta_5Si_3$ or $V_5Si_3$, greatly reduces the interface resistance generated at the interface between NiSi and silicon.

At the process step shown in FIG. 2C of this embodiment, during the deposition of the Ni film 112, a Ti film, TiN film or the stack of these films serving as a film for preventing oxidation of the Ni film 112 may be deposited on the Ni film 112. These anti-oxidation films may be removed simultaneously with selective removal of the unreacted Ni film 112.

Embodiment 2

Hereinafter, a semiconductor device according to a second embodiment of the present invention, specifically a semiconductor device including a MOS transistor, and a method for fabricating the device will be described with reference to the drawings.

Figure 4A:
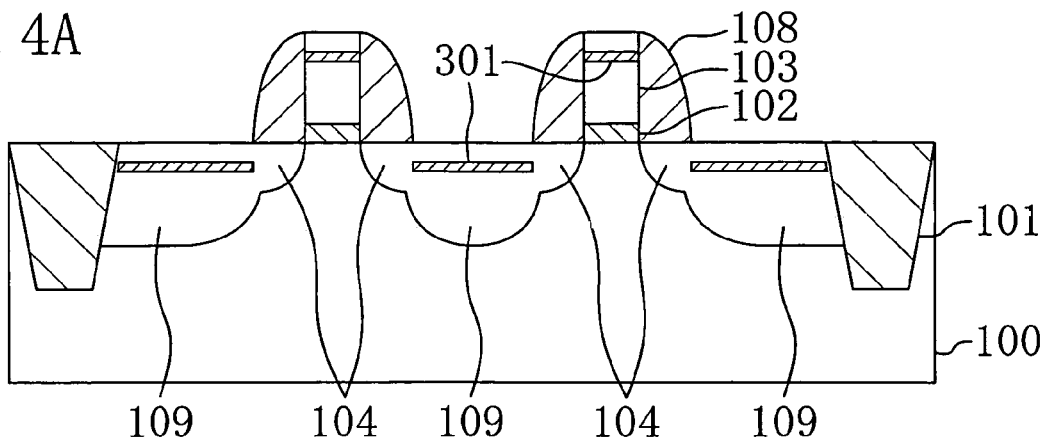
FIGS. 4A through 4C are cross-sectional views showing process steps of a method for fabricating a semiconductor device according to a second embodiment of the present invention.
Figure 4B:
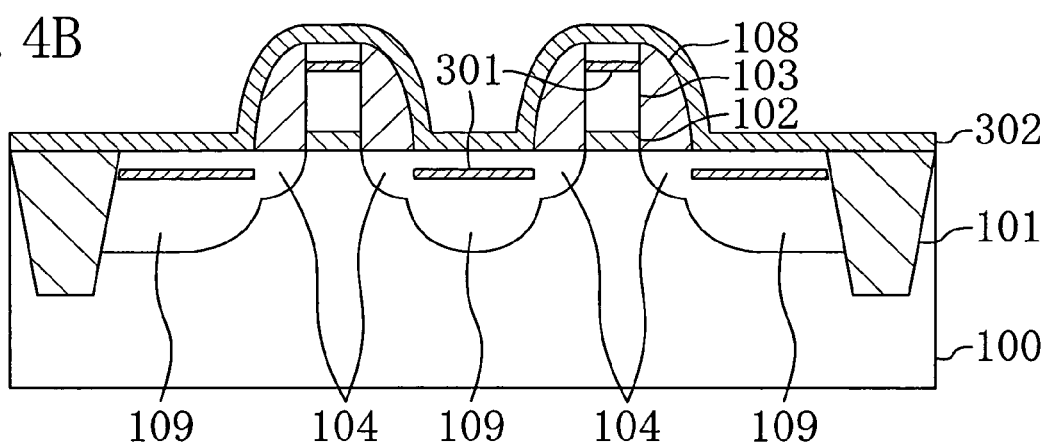
Figure 4C:
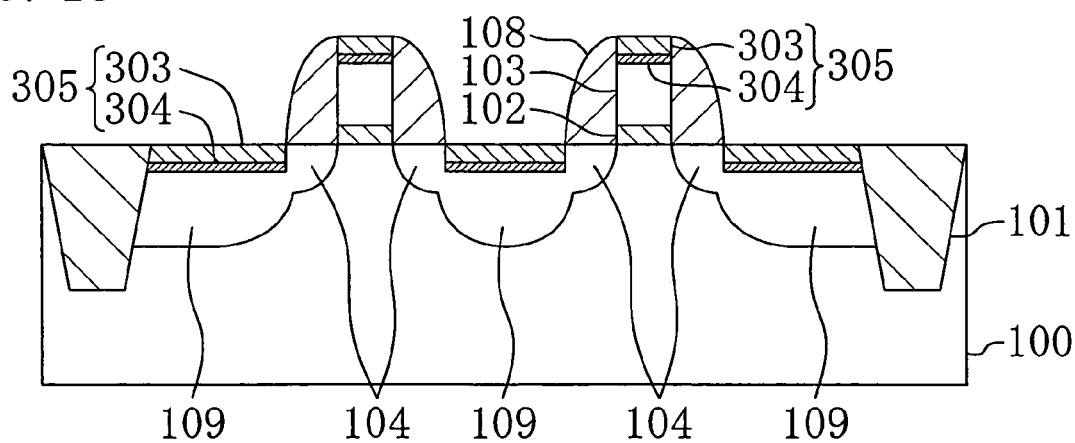

FIGS. 4A through 4C are cross-sectional views showing process steps of a method for fabricating a semiconductor device of this embodiment.

In this embodiment, first, process steps similar to those of the method for fabricating a semiconductor device of the first embodiment shown in FIGS. 1A through 1D are performed.

After the process step shown in FIG. 1D, in a silicon substrate 100 in which components to a heavily-doped layer 109 are formed, a metal capable of forming a metal silicide having a formation enthalpy lower than that of NiSi is introduced, e.g., Hf is introduced by ion implantation, in silicon portions forming the heavily-doped layer 109 to be source/drain regions and gate electrodes 103, thereby forming a Hf doped layer 301 as shown in FIG. 4A. In this case, during the ion implantation of Hf, to obtain a desired silicide thickness, the implantation energy is adjusted to satisfy that the implantation depth Rp (projection range) is 20 nm, for example. The amount of implanted Hf is also adjusted in the range from $5 \times 10^{15}$ cm$^{-2}$ to $1 \times 10^{18}$ cm$^{-2}$, for example.

Then, as shown in FIG. 4B, after the formation of the Hf doped layer 301, a Ni film 302 is deposited to a thickness of about 10 nm over the entire surface of the silicon substrate 100 by Ar sputtering under conditions of, for example, a pressure of 2 mTorr (266 mPa) and a DC power of 100 W.

Thereafter, after the deposition of the Ni film 302, a first RTA process is performed with, for example, RTA apparatus at 300° C. for 30 seconds in an inert atmosphere, and then the unreacted part of the Ni film 302 is selectively removed. Accordingly, a Ni silicide film is formed only on the heavily-doped layer 109 and the gate electrodes 103. In this case, the removal of the unreacted part of the Ni film 302 is selectively performed with an acid chemical solution which is a mixture of, for example, either sulfuric acid or hydrochloric acid and a hydrogen peroxide solution. Then, a second RTA process is performed at 500° C. for 30 seconds, for example, in an inert atmosphere such that the Ni silicide film has a desired NiSi composition. In this manner, as shown in FIG. 4C, a multilayer silicide layer 305 in which a Hf-rich interface Ni silicide layer (first interface silicide layer) 304 containing, for example, about 50 at % of Hf and a Ni silicide layer (second surface silicide layer) 303 are stacked in this order is formed. In other words, the Hf-rich interface Ni silicide layer 304 containing about 50 at % of Hf is an alloy layer made of Hf silicide and Ni silicide. The Schottky barrier height of the Hf-rich interface Ni silicide layer (first interface silicide layer) 304 is approximately expressed by the following equation (3):

$$\Phi_b = \Phi_{Ni} \cdot (1-[Hf]) + \Phi_{Hf} \cdot [Hf] \quad (3)$$

where $\Phi_b$ is a Schottky barrier height (eV) in the Hf-rich interface Ni silicide layer, $\Phi_{Ni}$ is a Schottky barrier height (0.68 eV) in Ni silicide, $\Phi_{Hf}$ is a Schottky barrier height (0.5 eV) in Hf silicide, and [Hf] is the ratio of a Hf content [at %]/(Ni content[at %]+Hf content[at %]) in the Hf-rich interface Ni silicide layer. According to equation (3), if the Hf-rich interface Ni silicide layer 304 contains about 50 at % of Hf, the Schottky barrier height is about 0.59 eV.

Specifically, in this embodiment, to reduce the Schottky barrier height between silicide and silicon, the ratio of Hf content/(Ni content+Hf content) in the Hf-rich interface Ni silicide layer 304, i.e., the first interface silicide layer, is preferably as high as possible. However, as long as the first interface silicide layer contains Hf, even if the ratio of Hf content/(Ni content+Hf content) is 50% or less, the effect of reducing the Schottky barrier height is expected.

In the second embodiment, since Hf is introduced in silicon in a region where the Hf doped layer 301 is formed, the silicon lattice is distorted so that a large difference in lattice constant between silicon and NiSi$_2$ can be obtained. As a result, generation of an inverted-pyramidal NiSi$_2$ interface is suppressed. In other words, the Hf-rich interface Ni silicide layer 304 having a lattice constant different from that of silicon is provided as an interface layer between silicide and silicon, so that generation of NiSi$_2$ forming an inverted-pyramidal interface between silicide and silicon caused by lattice-constant matching with silicon is suppressed. Accordingly, the Ni silicide layer (NiSi layer) 303 serving as a low-resistance layer is stabilized.

In addition, in the second embodiment, Hf is introduced, as a metal capable of forming a metal silicide having a formation enthalpy lower than that of NiSi, in portions where a silicide-silicon interface is to be formed in the heavily-doped layer 109 to be source/drain regions and the gate electrodes 103. Accordingly, the Hf-rich interface Ni silicide layer 304 containing about 50 at % of Hf is formed as an interface layer between silicide and silicon by the first and second RTA processes, so that the Schottky barrier height in the silicide-silicon interface decreases, as compared to a case where NiSi and silicon are in contact with each other. This reduces the interface resistance between silicide and silicon by about 10% in this embodiment, as compared to the case where NiSi and silicon are in contact with each other. In this manner, a silicide layer of an alloy layer including Ni silicide and a metal silicide having a formation enthalpy lower than that of NiSi is formed as an interface layer, so that the Schottky barrier height between silicide and silicon is reduced, thereby reducing the interface resistance between silicide and silicon.

Figure 5:
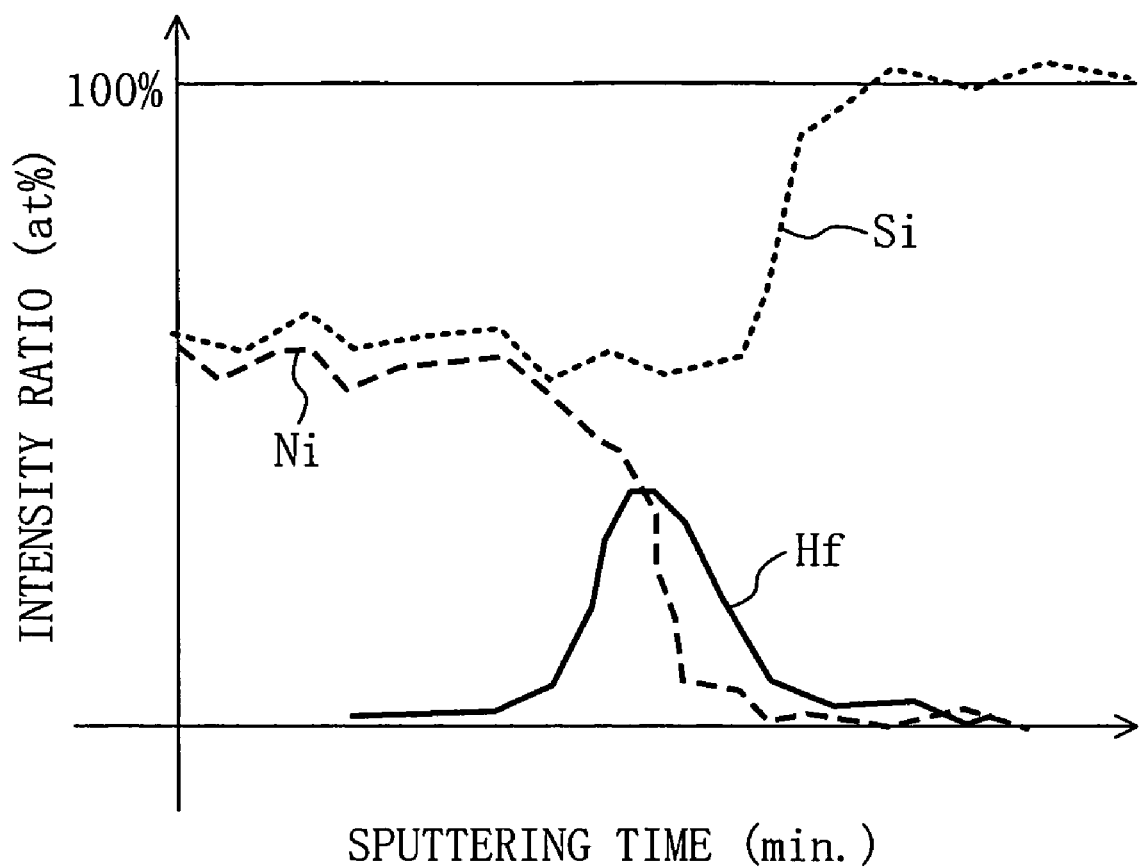
FIG. 5 is a graph showing distributions in the composition of a multilayer silicide layer in the depth direction in the semiconductor device of the second embodiment.

FIG. 5 shows distributions in the composition of the multilayer silicide layer 305 obtained by Auger analysis in the depth direction. In FIG. 5, the abscissa represents a sputtering time (min.) and the ordinate represents an AES intensity ratio (at %). The amount of sputtering per a unit time is substantially constant, so that the sputtering time is proportional to the depth from the surface of the sputtered film.

As shown in FIG. 5, the Hf-rich interface Ni silicide layer 304 is formed near the interface with silicon.

As described above, in this embodiment, both stable formation of a NiSi layer as a low-resistance layer and reduction of the interface resistance at the interface between NiSi and silicon are achieved, so that an excellent Ni silicide layer is formed. Accordingly, a semiconductor device capable of being miniaturized and operating at high speed is implemented.

In this embodiment, Hf is used as a metal which is introduced in silicon portions forming the heavily-doped layer 109 to be source/drain regions and the gate electrodes 103 and is capable of forming a metal silicide having a formation enthalpy lower than that of NiSi. Alternatively, other metals capable of forming metal silicides having generation enthalpies lower than that of NiSi, e.g., Zr, Mo, Ta and V, may be used.

In the process step shown in FIG. 4B of this embodiment, during the deposition of the Ni film 302, a Ti film, a TiN film or the stack of these films serving as a film for preventing oxidation of the Ni film 302 may be deposited on the Ni film 302. This anti-oxidation film may be removed simultaneously with selective removal of the unreacted Ni film 302.

Embodiment 3

Hereinafter, a semiconductor device according to a third embodiment of the present invention, specifically a semiconductor device including a MOS transistor, and a method for fabricating the device will be described with reference to the drawings.

Figure 6A:
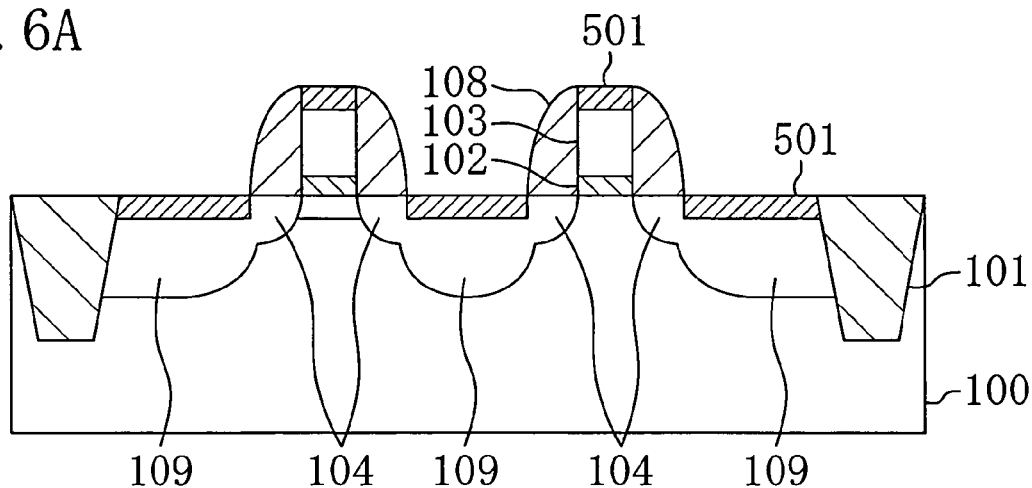
FIGS. 6A through 6C are cross-sectional views showing process steps of a method for fabricating a semiconductor device according to a third embodiment of the present invention.
Figure 6B:
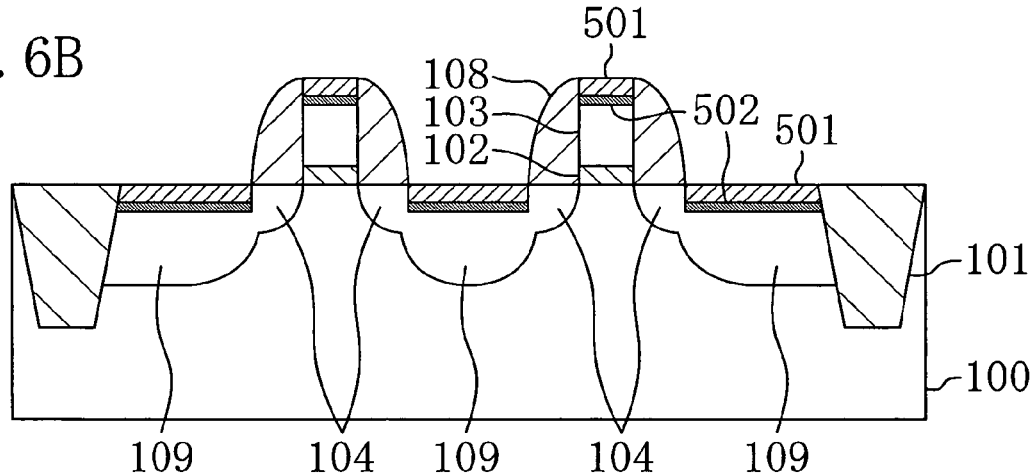
Figure 6C:
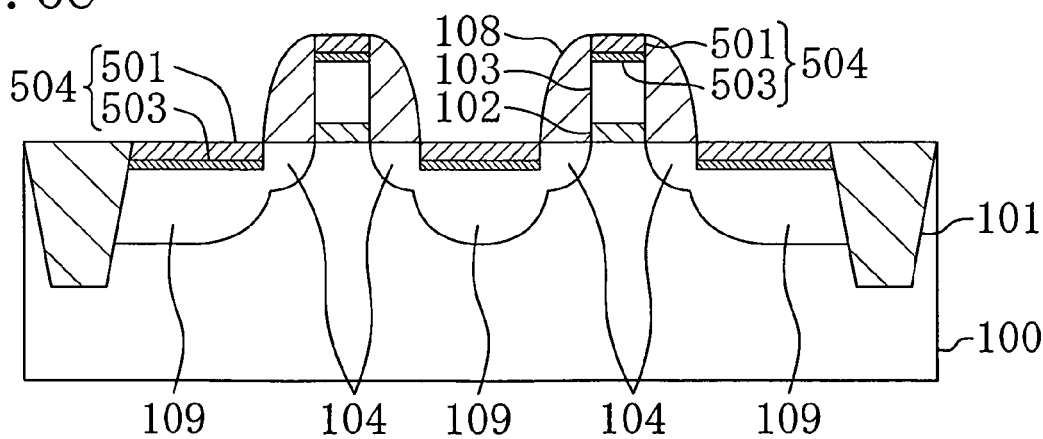

FIGS. 6A through 6C are cross-sectional views showing process steps of a method for fabricating a semiconductor device of this embodiment.

In this embodiment, first, process steps similar to those of the method for fabricating a semiconductor device of the first embodiment shown in FIGS. 1A through 1D are performed.

After the process step shown in FIG. 1D, in a silicon substrate 100 in which components to a heavily-doped layer 109 are formed, a Ni silicide film 501 is formed only on the heavily-doped layer 109 to be source/drain regions and gate electrodes 103 as in the second embodiment, as shown in FIG. 6A.

Then, as shown in FIG. 6B, a metal, such as Hf, capable of forming a metal silicide having a formation enthalpy lower than that of NiSi is introduced by ion implantation in silicon forming portions of the heavily-doped layer 109 to be source/drain regions and the gate electrodes 103 located under the Ni silicide film 501, thereby forming a Hf doped layer 502. In this case, during the ion implantation of Hf, to obtain a desired silicide thickness, the implantation energy is adjusted to satisfy that the implantation depth Rp is 20 nm, for example. The amount of implanted Hf is also adjusted in the range from $5 \times 10^{15}$ cm$^{-2}$ to $1 \times 10^{18}$ cm$^{-2}$, for example. It should be noted that Hf is also implanted in at least a lower portion of the Ni silicide film 501.

The Hf implantation shown in FIG. 6B makes the Hf doped layer 502, a silicon region near the Hf doped layer 502 (hereinafter, the Hf doped layer 502 and this silicon region will be collectively referred to as a doped-region vicinity) and the Ni silicide film 501 amorphous, and also makes the interface between the Ni silicide film 501 and silicon smooth.

Thereafter, after the formation of the Hf doped layer 502, an RTA process is performed in, for example, an inert atmosphere, thereby recrystallizing the amorphous doped-region vicinity and Ni silicide film 501. The temperature and time of this RTA process are adjusted in the range from 400° C. to 500° C. and in the range from 30 seconds to 60 seconds, respectively, for example. In this manner, as shown in FIG. 6C, a multilayer silicide layer 504 in which a Hf-rich interface Ni silicide layer (first interface silicide layer) 503 containing, for example, about 50 at % of Hf and the remaining Ni silicide film 501, i.e., a Ni silicide layer (second surface silicide layer) 501, are stacked in this order is formed, as a result, as in the second embodiment. In other words, the Hf-rich interface Ni silicide layer 503 containing about 50 at % of Hf is an alloy layer made of Hf silicide and Ni silicide. The Schottky barrier height of the Hf-rich interface Ni silicide layer (first interface silicide layer) 503 is approximately expressed by equation (3) mentioned above. According to equation (3), if the Hf-rich interface Ni silicide layer 503 contains about 50 at % of Hf, the Schottky barrier height is about 0.59 eV.

That is, as in the second embodiment, to reduce the Schottky barrier height between silicide and silicon, the ratio of Hf content [at %]/(Ni content [at %]+Hf content [at %]) in the Hf-rich interface Ni silicide layer 503, i.e., the first interface silicide layer, is preferably as high as possible. However, as long as the first interface silicide layer contains Hf, even if the ratio of Hf content/(Ni content+Hf content) is 50% or less, the effect of reducing the Schottky barrier height is expected.

In the third embodiment, since Hf is introduced in silicon in a region where the Hf doped layer 502 is formed, the silicon lattice is distorted so that a large difference in lattice constant between silicon and NiSi$_2$ can be obtained. As a result, generation of an inverted-pyramidal NiSi$_2$ interface is suppressed. In other words, the Hf-rich interface Ni silicide layer 503 having a lattice constant different from that of silicon is provided as an interface layer between silicide and silicon, so that generation of NiSi$_2$ forming an inverted-pyramidal silicide-silicon interface caused by lattice-constant matching with silicon is suppressed. Accordingly, the Ni silicide layer (NiSi layer) 501 as a low-resistance layer is stabilized.

In addition, in the third embodiment, as a metal capable of forming a metal silicide having a formation enthalpy lower than that of NiSi, Hf is introduced in portions of the heavily-doped layer 109 to be source/drain regions and gate electrodes 103 where the silicide-silicon interface is to be formed. Accordingly, the Hf-rich interface Ni silicide layer 503 containing about 50 at % of Hf is formed as an interface layer between silicide and silicon by the RTA process, so that the Schottky barrier height in the silicide-silicon interface decreases, as compared to a case where NiSi and silicon are in contact with each other. This reduces the interface resistance between silicide and silicon, as compared to the case where NiSi and silicon are in contact with each other. That is, a silicide layer which is an alloy layer made of Ni silicide and a metal silicide having a formation enthalpy lower than that of NiSi is formed as the interface layer, so that the Schottky barrier height between silicide and silicon is reduced, thereby reducing the interface resistance between silicide and silicon.

In this embodiment, Hf is used as a metal which is introduced in silicon forming portions of the heavily-doped layer 109 to be source/drain regions and the gate electrodes 103 and is capable of forming a metal silicide having a formation enthalpy lower than that of NiSi. Alternatively, other metals capable of forming metal silicides having generation enthalpies lower than that of NiSi, e.g., Zr, Mo, Ta and V, may be used.

In the process step shown in FIG. 6A of this embodiment, during the deposition of the Ni film for forming the Ni silicide film 501, a Ti film, a TiN film or the stack of these films serving as a film for preventing oxidation of the Ni film may be deposited on the Ni film. These anti-oxidation films may be removed simultaneously with selective removal of the unreacted Ni film after the formation of the Ni silicide film 501.

The invention claimed is:

1. A method for fabricationg a semiconductor device, the method comprising the steps of:
    forming a gate electrode on a silicon substrate;
    forming source/drain regions at both sides of the gate electrode in the silicon substrate; and
    forming a silicide layer with a multilayer structure on the soure/drain regions,
    wherein in the step of forming the silicide layer, a first silicide layer mainly made of a metal silicide having a formation enthalpy lower than that of NiSi is formed on the source/drain regions, and then a second silicide layer made of Ni silicide is formed on the first silicide layer.

2. A method for fabricating a semiconductor device , the steps of:
    forming a gate electrode on a silicon substrate;
    forming source/drain regions at both sides of the gate electrode in the silicon substrate; and
    forming a silicide layer with a multilayer structure on the source/drain regions,
    wherein in the step of forming the silicide layer, a metal capable of forming a metal silicide having a formation enthalpy lower than that of NiSi is introduced by ion implantation in the source/drain regions, then a Ni silicide film is formed on the source/drain regions, and then heat treatment is performed, thereby forming a first silicide layer which is an alloy layer made of Ni silicide and a metal silicide having a formation enthalpy lower than that of NiSi on the source/drain regions and also forming a second silicide layer made of Ni silicide on the first silicide layer.

3. A method for fabricating a semiconductor device, the method comprising the steps of:
    forming a gate electrode on a silicon substrate;
    forming source/drain regions at both sides of the gate electrode in the silicon substrate; and
    forming a silicide layer with a multilayer structure on the source/drain regions,
    wherein in the step of forming the silicide layer, a Ni silicide film is formed on the source/drain regions, then a metal capable of forming a metal silicide having a formation enthalpy lower than that of NiSi is introduced by ion implantation in at least a lower portion of the Ni silicide film and the Ni silicide film is changed into an amorphous state, and then the amorphous Ni silicide film is recrystallized by heat treatment, thereby forming a first silicide layer which is an alloy layer made of Ni silicide and a metal silicide having a formation enthalpy lower than that of NiSi on the source/drain regions and also forming a second silicide layer made of Ni silicide on the first silicide layer.

4. The method of claim 1, wherein the metal silicide having a formation enthalpy lower than that of NiSi is a silicide made from a material selected from the group consisting of Hf, Zr, Mo, Ta and V.

5. The method of claim 2, wherein the metal silicide having a formation enthalpy lower than that of NiSi is a silicide made from a material selected from the group consisting of Hf, Zr, Mo, Ta and V.

6. The method of claim 3, wherein the metal silicide having a formation enthalpy lower than that of NiSi is a silicide made from a material selected from the group consisting of Hf, Zr, Mo, Ta and V.

* * * * *